United States Patent [19]

Heard et al.

[11] Patent Number: 4,520,493
[45] Date of Patent: May 28, 1985

[54] ADAPTIVE RECURSIVE FREQUENCY OFFSET TRACKING SYSTEM

[75] Inventors: Charles M. Heard, Venice; Frank C. Yang, Anaheim, both of Calif.

[73] Assignee: Hughes Aircraft Company, El Segundo, Calif.

[21] Appl. No.: 327,667

[22] Filed: Dec. 7, 1981
(Under 37 CFR 1.47)

[51] Int. Cl.³ .............................................. H04L 27/16
[52] U.S. Cl. ....................................... 375/97; 375/81; 329/137
[58] Field of Search ....................... 375/80, 81, 94, 97, 375/118, 119; 329/2, 103, 110, 112, 137; 455/205, 337; 328/55, 133

[56] References Cited

U.S. PATENT DOCUMENTS

| 3,919,651 | 11/1975 | Le Mouel | 375/97 |
| 4,146,841 | 3/1979 | McRae | 375/119 |
| 4,177,427 | 12/1979 | Shores | 375/97 |
| 4,320,526 | 3/1982 | Gitlin | 375/118 |
| 4,328,587 | 5/1982 | Mizuno et al. | 375/80 |

OTHER PUBLICATIONS

W. C. Lindsey, "Synchronization Systems In Communication And Control", Inglewood Clifs, N.J., Prentice-Hall, pp. 478-480, 1972.

Primary Examiner—Marc E. Bookbinder
Assistant Examiner—Stephen Chin
Attorney, Agent, or Firm—W. J. Benman, Jr.; A. W. Karambelas

[57] ABSTRACT

An adaptive, recursive frequency offset tracking system for effectively acquiring and tracking coherent as well as noncoherent electromagnetic data signals transmitted with or without countermeasure protection. The invention includes circuitry for eliminating the carrier frequency and generating complex samples of the baseband signal. The invention compares the phase of a sample to that of the previous sample to extract signals representing the phase difference between the two. The signals representing the phase difference are then converted to phasor signals and filtered to eliminate any noise component. The phase difference signals are derived from the phasor signals and accumulated to derive signals representing the frequency offset of the received data signal. The frequency offset signal is then provided to a phase shifter to correct for the effect of Doppler shift on the received data signal.

14 Claims, 1 Drawing Figure

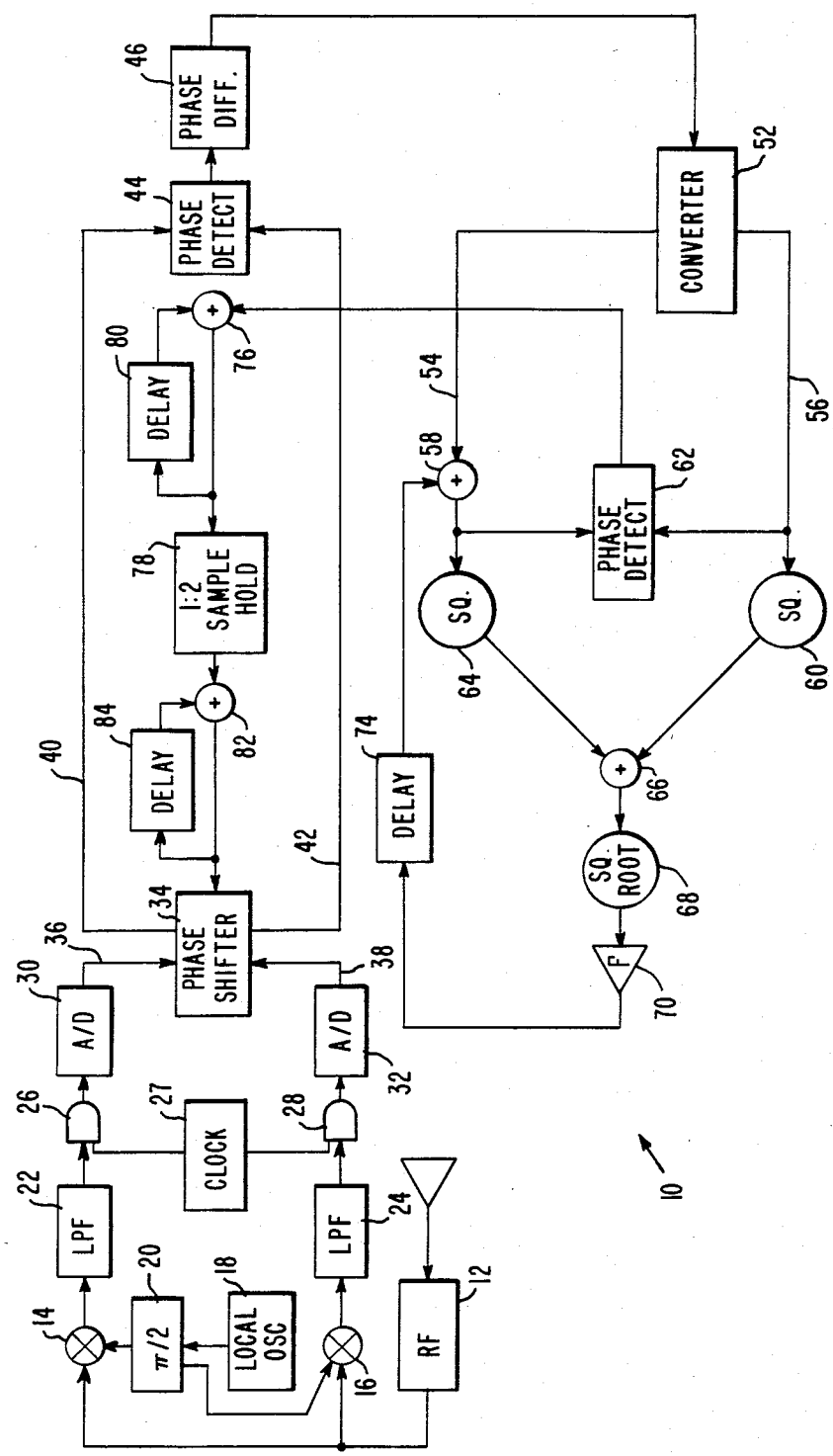

ADAPTIVE RECURSIVE FREQUENCY OFFSET TRACKING SYSTEM

BACKGROUND OF THE INVENTION

1. Field of the Invention

This invention relates to radio receivers. More specifically, this invention relates to communications modems which incorporate frequency tracking systems.

While the present invention is described herein with reference to particular embodiments and applications, it is to be understood that the invention is not limited thereto. Those of ordinary skill in the art having access to the teachings of this invention will recognize additional applications and embodiments within the scope thereof.

2. Description of the Prior Art

Remotely piloted aircraft or drones may be utilized to provide effective reconnaisance of an enemy position at the forward edge of a battle area. In hostile environment, the drones are subject to destruction by counterfire or being jammed by electronic countermeasures. As a result, it has come to be recognized that such remotely piloted aircraft should be equipped with minimally expensive dispensable hardware, sufficiently sophisticated to penetrate the enemy's electronic defenses.

Drones are currently guided by signals transmitted at relatively low data rates. The rate of transmission typically is on the order of a few hundred bits per second or less. When the aircraft is in flight, the transmitted signals experience Doppler shift in the carrier signal which induces drift or frequency offset in the demodulated data signal. With a carrier signal on the order of 10GHz and the drone flying at a velocity of a few hundred miles per hour, the Doppler shift is on the order of the data rates. The Doppler effect thus interferes with the capability of the drone to receive and interpret guidance commands.

Systems which employ phase lock loops (including decision directed loops) to track the carrier frequency are effective in overcoming the effect of Doppler shift. However, such systems are typically limited in operation to coherent signals, i.e., those having long term phase continuity relative to the time constant of the phase lock loop.

These systems would provide adequate frequency tracking were it not for the desirability of hardening the drone against countermeasures. Unfortunately, some very effective counter-countermeasures, particularly frequency hopping, render the received signal substantially noncoherent.

It is therefore desirable to provide an inexpensive communications modem for use in remotely piloted vehicles which is capable of compensating for Doppler shift in the carrier frequency while being compatible with conventional electronic counter-countermeasure signal preprocessing techniques.

SUMMARY OF THE INVENTION

The present invention is an adaptive recursive frequency offset tracking system for effectively acquiring and tracking coherent and well as non-coherent electromagnetic data signals.

The system includes circuitry for eliminating the carrier frequency and generating complex samples of the baseband signal.

The system compares the phase of a sample to that of the previous sample to extract signals representing the phase difference between the two. The signals representing the phase difference are then converted to phasor signals and filtered to eliminate any noise component.

The phase difference signals are derived from the phasor signals and accumulated to derive signals representing the frequency offset of the received data signal.

The frequency offset signal is then provided to a phase shifter to correct for the effect of Doppler shift on the received data signal.

BRIEF DESCRIPTION OF THE DRAWINGS

The FIGURE is a block diagram of an illustrative embodiment of the present invention.

DESCRIPTION OF THE INVENTION

The illustrative embodiment of the present invention 10 is shown in the FIGURE. The radio frequency subsystem 12, though not part of the invention, is shown for the purpose of illustration. Radio signals received by an antenna are amplified and converted to an intermediate frequency $\omega_o$ by the RF subsystem 12, and are fed into demodulators 14 and 16 which are driven by the cosine and sine of $\omega_o t$ and respectively. The sin $\omega_o t$ and cos $\omega_o t$ are generated by the $\pi/2$ phase splitter (quadrature hybrid) 20 which operates on the output of the local oscillator 18. The carrier signal is removed by the demodulators 14 and 16 which serve to generate the complex representation of the received signal. The outputs of demodulators 14 and 16 are input to low pass filters 22 and 24. The outputs of filters 22 and 24 are switched by gates 26 and 28 respectively which operate under the control of a clock 27. Note that in cases where the frequency $\omega_o$ is not constant (as would be the case for a frequency hopped signal) a timing recovery mechanism (not shown) would be required to synchronize the sampling clock with the local oscillator. (For the purposes of illustration, the remaining clock connections are not shown to the circuits of the present invention. The timing and clocking of the present invention is obvious to one of ordinary skill in the art.) The outputs of sampling gates 26 and 28 are input to analog-to-digital (A/D) converters 30 and 32 respectively. The outputs of the A/D converters 30 and 32 are input to a phase shifter 34 via lines 36 and 38 respectively. The real part of the complex digital data signal is provided on line 36. The imaginary part of the complex digital data signal is provided on line 38.

The phase shifter 34 effectively corrects the phase of the signal received on lines 36 and 38 by an amount determined by the circuitry to be discussed more fully below. The real part of the signal shifted by the phase shifter 34 appears on line 40 and is input to a phase detector 44. The imaginary part of the signal shifted by the phase shifter 34 appears on line 42 and is also input to the phase detector 44. The phase detector 44 extracts the phase angle of the shifted signal. This output is applied to a modulo $2\pi$ phase differentiator 46, which supplies one output sample for each pair of input samples. The output of the modulo $2\pi$ phase differentiator 46 is input to a converter 52. The converter 52 converts the signals to phasor form. The cosine of the converted signal appears on line 54 and the sine of the converted signal appears on line 56. Line 54 feeds a summer 58 while line 56 feeds a squaring operator 60 and a phase detector 62. The output of the summer 58 is input to the phase detector 62 and a second squaring operator 64.

The squaring operators 60 and 64 input to a summer 66. The square root operator 68 operates on the output of the summer 66 to provide a signal to a damping amplifier 70. This square root of the sum of the squares equals the magnitude of the complex signal applied to the phase detector 62. The damping factor F is introduced by the amplifier 70 as a design parameter to control the loop bandwidth. The output of the amplifier 70 is input to a delay circuit 74. The output of the delay circuit is fed into the summer 58.

For reasons which will be more evident from the discussion of the operation of the invention below, the output of the phase detector 62 is input to a summing circuit 76. The summer 76 adds to the output of the phase detector 62 a signal equal to the previous output of the summer 76 which is provided by the delay circuit 80. The output of the summer 76 is sampled and held by circuit 78 which provides a 1:2 resampling of the signal. A summer 82 then sums the sampled and held signal with its previous output as provided by the delay circuit 84 and provides the phase shift correction to the phase shifter 34.

The operation of the present invention can best be understood with reference to the following mathematical discussion. The signals received by the RF subsystem 12 can be assumed to have the form Z(t). This represents a signal at a center carrier frequency of $\omega_0$; the signal is assumed to be continuous over two consecutive sampling intervals. The demodulators 14 and 16 operate with the local oscillator 18 and the phase shifter 20 to remove the carrier signal and create a complex baseband signal from the received signal.

The low pass filters 22 and 24 average the received signals Z(t) by integrating over a time interval $T_s$ (one sampling interval). Switches 26 and 28 are clocked to sample the complex baseband signal to derive a plurality of complex samples. The $l^{th}$ sample of the complex baseband signal may be expressed by the following equation.

$$Z_l = \frac{1}{T_s} \left[ \int_{t-T_s}^{t} Z(t')e^{-j\omega_0 t'} dt' \right]_{t=l \cdot T_s} \quad [1]$$

Multiplication by $e^{-j\omega_0 t'}$ represents the action of the demodulators 14 and 16. The integral is evaluated at a time t which is equal to the product of the sample number l times the sampling interval $T_s$.

The angular frequency offset $\delta$ which the system 10 of the present invention substantially compensates for is equal to the phase difference due to frequency offset between successive samples $\psi$ divided by the sampling interval $T_s$ or $$\delta = \frac{\psi}{T_s}$$

The frequency offset $\delta$ is assumed to remain essentially constant. The first two samples are passed through the phase shifter 34 to the phase detector 44 without correction. The modulo $2\pi$ phase differentiator 46 compares the phase angle of one sample to that of the previous sample. That is, the first and second samples are compared. The phase differentiator 46 stores a first phase angle within a pair and subtracts it from the second phase angle within a pair to provide an output to the converter 52 which is equal to the phase difference therebetween. Note that there will be half as many outputs from the phase differentiator 46 as there are samples as it requires two samples to provide a single output. The phase detector 44 and the phase differentiator 46 together provide means for comparing the phase of successive samples to extract signals representing the phase difference between two samples.

The phase difference $\phi$ is converted to a phasor $e^{j\phi}$ by converter 52. Note that conventional systems filter the phase difference signal at this processing stage. As a result, conventional systems are inclined to suffer from a momentary inability to correctly compute the proper correction when the phase difference is $\pi$ or $-\pi$; this is due to confusion as to which sign the correction should have. For further discussion see Gardner, F. L., "Hangup in Phase Locked Loops", IEEE Trans. on Communications COM-25, No. 10, pp. 1210–1214, October 1977. Conversion to a phasor signal at this point is advantageous relative to the systems of the prior art insofar as the phasor output for a phase difference of $\pi$ is identical from that for a phase difference of $-\pi$. As a result, the system of the present invention will not get confused and therefore is expected to exhibit markedly smaller acquisition time than such prior art systems.

In addition, conversion to phasor signals allows the loop bandwidth to be adjusted dynamically, based on a track quality indication, as is explained below.

The phasor signals representing the phase difference between successive samples are provided as outputs on lines 54 and 56. By Euler's equation, $e^{j\phi} = \cos\phi + j\sin\phi$ where j is equal to the square root of $-1$. Accordingly, the $\cos\phi$ appears on line 54 and the $\sin\phi$ appears on line 56.

The summing circuit 58, squaring operators 60 and 64, phase detector 62, summing circuit 66, squaring operator 68, damping amplifier 70, and delay operator 74 provide means for filtering the phasor signals to remove the effects of noise. The output of the low pass filter is given by the following equation:

$$\rho_k e^{j\hat{\psi}_k} = F\rho_{k-1}e^{j\hat{\psi}_{k-1}} + e^{j\phi_k} \quad [3]$$

where $\rho_k e^{j\hat{\psi}_k}$ is the output of the low pass filter expressed as a complex quantity; $\hat{\psi}_k$ is the phase of the filter output and $\rho_k$ is the magnitude of the filter output. F is the damping factor of the filter chosen as a system parameter to determine filter averaging time and thus to control the loop bandwidth.

The low pass filter operation may be best explained in polar coordinates. Equation [3] is equivalent to equations [4] and [5] below. That is, to examine the magnitude $\rho_k$ of equation [3], one may multiply the right hand side of the equation by the term $e^{-j\hat{\psi}_{k-1}}$. Since this term is an argument term, it does not affect the magnitude $\rho_k$ which may therefore be expressed by equation [4] below.

$$\rho_k = \| F\rho_{k-1} + e^{j(\phi_k - \hat{\psi}_{k-1})} \| \quad [4]$$

Equation [4] provides the magnitude of the filter output and equation [5] below provides the phase. The phase $\hat{\psi}_k$ is equal to the argument of equation [4] plus a term which compensates for the multiplication at the right hand side of equation [3] by $e^{-j\hat{\psi}_{k-1}}$. Thus, $$\hat{\psi}_k = \hat{\psi}_{k-1} + arg\{F\rho_{k-1} + e^{j(\phi_k - \hat{\psi}_{k-1})}\} \quad [5]$$

$\hat{\psi}_k$ is therefore the estimate at time $t=2kT_s$ of the phase difference between samples of the input signal Z and $F\rho_{k-1}$ is the bandwidth control and loop tracking quality indicator.

Squaring operators 60 and 64, summer 66 and square root operator 68 cooperate to provide the magnitude of the phasor output of the converter 52. The damping factor is applied by the amplifier 70 and fedback to delay operation 74 so that $F\rho_k$ is stored and becomes $F\rho_{k-1}$ for the subsequent iteration.

The phase detector 62 provides means for extracting the phase difference signals from the phasor signal to provide the estimate of phase difference $\hat{\psi}_k$ of equation [5]. It provides the argument of the sum of the current phasor and the previous filter output. See equation [3].

The estimate of phase difference between successive samples of the input signal Z(t) is provided by the phase detector 62 as an input to the summing circuit 76. The previous output of the summing circuit 76 is fed back to the summer 76 via delay operator 80. The absolute phase estimate $\hat{\theta}$ referenced to a k index can be expressed by equations [6] and [7] below:

$$\hat{\theta}_{2k+2} = \hat{\theta}_{2k+1} + \hat{\psi}_k \quad [6]$$

$$\hat{\theta}_{2k+1} = \hat{\theta}_{2k} + \hat{\psi}_k \quad [7]$$

Thus, $\hat{\psi}_k$ is the phase increment used to accumulate the absolute phase correction $\hat{\theta}_l$. There are two equations here because one new value of $\hat{\psi}_k$ generates two values of $\hat{\theta}_l$. The k index arises from the condition that two k samples are required for each l correction. The 1:2 sample and hold circuit 78 facilitates the conversion from the k index to the l index. The equivalent equation referenced to the l index is:

$$\hat{\theta}_l = \hat{\theta}_{l-1} + \hat{\psi}_k \quad [8]$$

where $l=2k+2$ or $l=2k+1$.

Summer 82 and delay operator 84 cooperate to input to the phase shifter 34 the previous absolute phase estimate $\hat{\theta}_{l-1}$ plus the estimate of the phase difference between successive samples $\hat{\psi}_k$ as required by equation [8]. Thus summer 76, sample and hold circuit 78, delay operator 80, summing circuit 82, and delay operator 84 cooperate to provide means for accumulating the extracted phase difference signals to derive signals representing the frequency offset of the received data signal.

Recalling equation [2], the frequency offset δ is equal to the phase difference ψ divided by the sampling interval $T_s$. The measurement $\Delta\psi_k$ is computed as $$\Delta\psi_k = \phi_k - \hat{\psi}_{k-1} = arg\{Z_{2k}e^{-j\hat{\theta}_{2k}}\} - arg\{Z_{2k-1}e^{-j\hat{\theta}_{2k-1}}\} \quad [9]$$

which is equivalent to what was given above because $$\hat{\psi}_{k-1} = \hat{\theta}_{2k} - \hat{\theta}_{2k-1} \text{ and} \quad [10]$$

$$\phi_k = arg\{Z_{2k}\} - arg\{Z_{2k-1}\} \quad [11].$$

The phase shifter 34 provides means for shifting the phase of the received data signal in response to the accumulated phase difference signals to substantially compensate for the frequency offset. The resulting phase estimate $\hat{\theta}_l$ is applied to the input signal $Z_l$ such that the output of the phase shifter 34 is the corrected signal $Z_l e^{-j\hat{\theta}_l}$.

The embodiment of FIG. 1 is referred to as an illustrative embodiment for two reasons. First, the demodulator subsystem (components 14 through 32) may vary in its detailed configuration depending on the nature of the signals whose frequency offset is to be estimated. Second, the preferred embodiment of the tracking subsystem (components 34 through 84) would be implemented on a digital computer by means of a program. The listing of one such program (written in the language PASCAL) is attached. The inputs to this program are the signals on data lines 36 and 38 and the outputs are the signals on data lines 40 and 42.

While the present invention has been described above with reference to particular embodiments and applications, it is to be understood that the invention is not limited thereto. Those having ordinary skill in the art and access to the teachings of the present invention will recognize additional embodiments and applications within the scope thereof. It is contemplated by the appended claims to cover any and all such applications.

```
Program Frequency Offset Tracking Subsystem (InputFile, OutputFile);
(* Written in support of PD 79135 by C. M. Heard 21-Sep-81.         *)
(* This program demonstrates one method of implementing the         *)
(* tracking subsystem of the Adaptive Recursive Frequency           *)
(* Offset Tracking System. Note that this subsystem does not        *)
(* include the demodulator subsystem. The demodulator timing        *)
(* circuitry must be arranged to produce pairs of complex           *)
(* samples with a coherent phase relationship between the two       *)
(* elements in a pair; in a frequency hopping system, for           *)
(* instance, each pair would be derived from one dwell on the       *)
(* same hop frequency. Phase coherence across samples in            *)
(* different pairs (e.g., across multiple hops, to use              *)
(* the same illustration as before) is not required.                *)
(* The methods used to build such a demodulator would be            *)
(* known to a person skilled in the prior art.                      *)
(* In this program, the demodulator subsystem is presumed to        *)
(* be connected to a computer input/output port which is            *)
(* assigned to the logical file InputFile. The buffer               *)
(* variable associated with this file is filled with a              *)
(* record (consisting of one pair of complex samples from           *)
(* the demodulator subsystem) each time a 'reset' or 'get' is       *)
(* performed on the file. The required queuing and process          *)
(* synchronization is performed by the operating system under       *)
(* which this program is run, the details being obvious to a        *)
(* person of ordinary skill in the art. Each complex sample         *)
(* is represented by a pair of real numbers. Please note that       *)
(* that although this representation is preferred, others are       *)
(* possible -- in particular, complex numbers may be repre-         *)
(* sented as pairs of integers -- and that the claims should        *)
(* be understood to cover all such representations.                 *)
(* Likewise, phase angles could be represented as two's             *)
(* complement integers instead of real numbers as below.            *)
(* Output from the tracking subsystem is directed to the            *)
(* file OutputFile, which contains records consisting of            *)
(* pairs of frequency-corrected complex samples representing        *)
(* output from one cycle of the tracking subsystem. It may be       *)
(* directed to any appropriate device, depending on the             *)
(* application. One record is written on each 'put' operation       *)
```

```
 1      Const
 2              Pi =   3.1415926;    (* Used for angle manipulations      *)
 3              F  =   0.9531250;    (* Damping factor of 63/64 selected  *)
 4
 5      Type
 6              Complex = Record
 7                          RealPart, ImagPart: Real;
 8                          End;
 9
10              InputSample  = Record
11                             FirstSample, SecondSample: Complex;
12                             End;
13
14              OutputSample = Record
15                             FirstSample, SecondSample: Complex;
16                             End;
17
18      Var
19              (* External Files *)
20              InputFile: File Of InputSample;
21              OutputFile: File Of OutputSample;
22
23              (* State Variables *)
24              PhaseCorrection: Real;
25              PhaseIncrement: Real;
26              TrackQualityIndication: Real;
27
28              (* Working Variables *)
29              PhaseDerivative: Real;
30              PhasorAccumuland: Complex;
```

```
Procedure AccumulatePhase(Var Accumuland: Real; Increment: Real);
(* Increase Accumuland by Increment and reduce modulo 2*pi *)
(* Implements all modulo 2*Pi Phase Accumulators            *)
Begin
  Accumuland := Accumuland+Increment;
  If Accumuland >= Pi
  Then Accumuland := Accumuland-
                     (2.0*Pi)*((Trunc(Accumuland/Pi)+1) Div 2)
  Else
  If Accumuland < -Pi
  Then Accumuland := Accumuland-
                     (2.0*Pi)*((Trunc(Accumuland/Pi)-1) Div 2)
End;

Procedure ShiftPhase(PhaseShift: Real; InputSample: Complex;
                                    Var OutputSample: Complex);
  (* Shift phase of InputSample by amount indicated by PhaseShift *)
  (* Implements the Phase Shifter                                 *)
  Var RotPhasor: Complex;
  Begin
    RotPhasor.RealPart := Cos(PhaseShift);
    RotPhasor.ImagPart := Sin(PhaseShift);
    OutputSample.RealPart := InputSample.RealPart*RotPhasor.RealPart
                             +
                             InputSample.ImagPart*RotPhasor.ImagPart;
    OutputSample.ImagPart := InputSample.ImagPart*RotPhasor.RealPart
                             -
                             InputSample.RealPart*RotPhasor.ImagPart;
  End;
```

```
    Function DetectedPhase (InputSample: Complex): Real;
1   (* Returns argument of InputSample *)
2   (* Implements all phase detectors *)
3   Begin
4    With InputSample Do
5       If RealPart < 0.0
6       Then Begin
7           If ImagPart < 0.0
8           Then DetectedPhase := Arctan(ImagPart/RealPart)-Pi
9           Else DetectedPhase := Arctan(ImagPart/RealPart)+Pi
10          End
11      Else
12      If RealPart = 0.0
13      Then Begin
14          If ImagPart < 0.0
15          Then DetectedPhase := -Pi/2.0
16          Else
17          If ImagPart = 0.0
18          Then DetectedPhase := 0.0
19          Else
20          If ImagPart > 0.0
21          Then DetectedPhase := +Pi/2.0
22          End
23      Else Begin
24          DetectedPhase := Arctan(ImagPart/RealPart)
25          End
26  End;
```

```
Procedure DifferentiatePhase(SecondSample, FirstSample: Real;
                             Var PhaseDerivative: Real);
  (* Take modulo 2*Pi difference of Phase Samples *)
  (* Implements the Phase Differentiator           *)
  Begin
    PhaseDerivative := SecondSample-FirstSample;
    If PhaseDerivative >= Pi
    Then PhaseDerivative := PhaseDerivative-
                    2.0*Pi*((Trunc(PhaseDerivative/Pi)+1) Div 2)
    Else
    If PhaseDerivative < -Pi
    Then PhaseDerivative := PhaseDerivative-
                    2.0*Pi*((Trunc(PhaseDerivative/Pi)-1) Div 2)
  End;

(* Implementation of remainder of functions:     *)
(* Conversions from phase angles to phasors      *)
(*   are done with standard functions Cos, Sin   *)
(* Squaring done with standard function Sqr      *)
(* Square root done with standard function Sqrt  *)
```

```
1   Begin
2     (* Assign Initial Values To Input Buffer & State Variables *)
3     Reset(InputFile);
4     Rewrite(OutputFile);
5     PhaseCorrection := 0.0;
6     PhaseIncrement := 0.0;
7     TrackQualityIndication := 0.0;
8     (* Iterate loop operation while there are input samples *)
9     While Not Eof(Inputfile) Do
10        Begin
11          AccumulatePhase(PhaseCorrection, PhaseIncrement);
12          ShiftPhase(PhaseCorrection, InputFile↑.FirstSample,
13                                     OutputFile↑.FirstSample);
14          AccumulatePhase(PhaseCorrection, PhaseIncrement);
15          ShiftPhase(PhaseCorrection, InputFile↑.SecondSample,
16                                     OutputFile↑.SecondSample);
17          DifferentiatePhase(DetectedPhase(OutputFile↑.SecondSample),
18                             DetectedPhase(OutputFile↑.FirstSample),
19                             PhaseDerivative);
20          PhasorAccumuland.RealPart := Cos(PhaseDerivative)*
21                                       TrackQualityIndication;
22          PhasorAccumuland.ImagPart := Sin(PhaseDerivative);
23          AccumulatePhase(PhaseIncrement, DetectedPhase(PhasorAccumuland));
24          TrackQualityIndication := F*Sqrt(Sqr(PhasorAccumuland.RealPart)+
25                                      Sqr(PhasorAccumuland.ImagPart));
26          Put(OutputFile);
27          Get(InputFile);
28        End;
29  End.
```

No error detected

Highseg:   1K
Lowseg :   1K

What is claimed is:

1. An adaptive recursive frequency offset tracking system for acquiring and tracking a received electromagnetic data signal comprising:
   - means for generating a complex baseband signal from the received signal;
   - means for sampling the complex baseband signal to derive a plurality of complex samples;
   - means for comparing the phase of successive samples to extract signals representing the phase difference between the two samples;
   - means for converting the phase difference signals to phasor signals;
   - first filter means for deriving a track quality indication from the phasor signals;
   - second filter means having a bandwidth controlled by the track quality indication for deriving from the phasor signals an estimate of the frequency offset of the received data signal; and
   - means for correcting the phase of the received data signal samples in response to the estimate of frequency offset to substantially compensate for the frequency offset.

2. The system of claim 1 wherein said means for generating a complex baseband signal from the received signal includes a local oscillator, a 90° phase splitter which operates on the output of the local oscillator, first and second demodulators which operate on the received data signal to demodulate the signal in accordance with inputs provided by the 90° phase splitter and the local oscillator, and first and second low pass filters which filter the outputs of the first and second demodulators to provide the real and complex components, respectively, of the complex baseband signal.

3. The system of claim 2 wherein said means for sampling the complex baseband signal to derive a plurality of complex samples includes gating means connected to the output of said first and second low pass filters and means for timing said gating means to achieve substantially simultaneous operation during predetermined intervals of time.

4. The system of claim 1 wherein said means for comparing the phase of successive samples to extract signals representing the phase difference between two samples includes a phase detector and a phase differentiator.

5. The system of claim 4 wherein said means for converting the phase difference signals to phasor signals includes a converter which operates on the output of the phase differentiator to provide first and second outputs, said first output providing the real component of the phasor signal and said second output providing the imaginary component of the phasor signal, respectively.

6. The system of claim 5 wherein said first filter means includes first and second squaring operators which operate on the first and second outputs of said converter, means for summing the outputs of said first and second squaring operators, means for providing the square root of the output of said summing means, and feedback means for adding with delay the square root of the output of the summing means to the real component of the output of said converter.

7. The system of claim 6 wherein said second filter means includes a second phase detector having inputs provided from the inputs of said squaring operators and means for summing the output of the phase detector with a previous estimate of frequency offset.

8. The system of claim 7 wherein said second filter means includes means for resampling the outputs of said second phase detector and means for integrating the output of said means for resampling.

9. An adaptive recursive frequency offset tracking system, for acquiring and tracking a received signal $Z(t)$, comprising the following elements:
   - means for converting the received signal $Z(t)$ into a sequence of complex baseband samples $Z_l$, of the form $$Z_l = \left[ \int_{-d}^{t} h(t-t')Z(t')e^{-j\omega_o t'}dt' \right]_{t=l \cdot T_s}$$

where $T_s$ is a suitable sampling interval, $\omega_o$ is the nominal radian center frequency of $Z(t)$ at the instant of sampling, $h(t)$ is a low-pass filter impulse response of effective duration less than or equal to $T_s$, and $l$ is an integer sample index;

- means for shifting the phase of each complex baseband sample $Z_l$ by a phase correction term $\hat{\theta}_l$ derived from a normalized estimate of the frequency offset to produce a substantially frequency corrected sample $Z_l'$, of the form $$Z_l' = Z_l e^{-j\hat{\theta}_l};$$

- means for generating from pairs of consecutive frequency corrected samples $(Z'_{2k}, Z'_{2k-1})$ a single complex phasor difference sample $U_k$ having an argument of the form $$\arg(U_k) = \arg(Z'_{2k}) - \arg(Z'_{2k-1})$$

where $k$ is a sample index related to the original sample index by $$k = (l+1)/2;$$

- means for filtering the frequency of said phasor difference samples to produce, for each such sample $U_k$, a real-valued track quality indicator $\rho_k$ and a normalized estimate of frequency offset $\hat{\psi}_k$ in units of radians of phase shift per sampling interval $T_s$, according to the joint relationship $$\rho_k = \|F\rho_{k-1} + U_k\|$$

$$\hat{\psi}_k = \hat{\psi}_{k-1} + \arg(F\rho_k + U_k)$$

where $F$ is a real damping factor between $0$ and $1$ inclusive and $\rho_{k-1}$ and $\hat{\psi}_{k-1}$ represent the results of the previous filtering operation;

- means for deriving, for each sample index $l$, the above-mentioned phase correction terms $\psi_k$, such that $$\hat{\theta}_l = \hat{\theta}_{l-1} + \hat{\psi}_k$$

or equivalently, $$\hat{\theta}_{2k+2} = \hat{\theta}_{2k+1} + \hat{\psi}_k$$

$$\hat{\theta}_{2k+2} = \hat{\theta}_{2k} + \hat{\psi}_k.$$

10. The system of claim 9 wherein said means for converting the received signal $Z(t)$ into a sequence of complex baseband samples $Z_l$ includes a local oscillator of radian frequency $\omega_o$; a 90° phase splitter which operates on the output of the local oscillator to produce in-phase and quadrature replicas of the local oscillator signals; in-phase and quadrature demodulators to effect multiplication of the received signal $Z(t)$ by the in-phase and quadrature replicas of the local oscillator signal, respectively; in-phase and quadrature low-pass filters which operate on the output of the in-phase and quadrature demodulators, respectively, to produce the real and imaginary parts of a complex baseband signal; and means for sampling the complex baseband signal at predetermined instants of time $t=l \cdot T_s$ in order to produce each complex baseband sample $Z_l$.

11. The system of claim 9 wherein the means for shifting the phase of each complex baseband sample consists of a phase shifter which acts upon the real and imaginary parts of each complex baseband sample $Z_l$ and upon a phase correction term $\theta_l$ to produce the real and imaginary parts of a frequency-corrected sample $Z_l'$ according to the relationships $$Re(Z_l')=\cos \hat{\theta}_l \cdot Re(Z_l) + \sin \hat{\theta}_l \cdot Im(Z_l)$$

$$Im(Z_l')=\cos \hat{\theta}_l \cdot Im(Z_l) + \sin \hat{\theta}_l \cdot Re(Z_l).$$

12. The system of claim 11 wherein the means for generating from each pair of consecutive frequency-corrected samples ($Z'_{2k}$, $Z'_{2k-1}$) a complex phasor difference sample $U_k$ includes a phase detector acting upon the outputs of said phase shifter to extract the argument of each corrected sample;

a phase differentiator acting on the output of said phase detector to extract the phase difference $\Delta\Psi_k$ between the two samples in each pair according to the relationship $$\Delta\Psi_k = \arg(Z_{2k}) - \arg(Z_{2k-1}),$$

thereby also providing a 2:1 resampling of its input sequence; and a converter acting upon the output of the phase differentiator to generate each complex phasor difference sample $U_k$ exactly or approximately according to the input/output relationship $U_k = e^{j\Delta\Psi_k}$, where the real and imaginary parts are given by $$Re(U_k) = \cos \Delta\Psi_k$$

$$Im(U_k) = \sin \Delta\Psi_k.$$

13. The system of claim 12 wherein the means for filtering the sequence of phasor difference samples $U_k$ to produce a track quality indicator $\rho_k$ and a normalized frequency offset estimate $\hat{\Psi}_k$ includes:

a first delay element which stores a sealed version $F\rho_{k-1}$ of the previously generated track quality indicator;

a first summation element acting upon the output of said delay element and upon the real part $Re(U_k)$ of the output of said converter to produce $Re(F\rho_{k-1}+U_k)$;

a first squaring element acting upon the output of said first summation element to produce $(Re(F\rho_{k-1}+U_k))^2$;

a second squaring element acting upon the imaginary part $Im(U_k)$ of the output of said converter to produce $(Im(F\rho_{k-1}+U_k))^2$;

a second summation element acting upon the output of said first and second squaring elements to produce $(Re(F\rho_{k-1}+U_k))^2+(Im(F\rho_{k-1}+U_k))^2$;

a square root operator acting upon the output of said second summation element to produce the track quality indicator $\rho_k$ according to the relationship $$\rho_k = \sqrt{(Re(F\rho_{k-1}+U_k))^2 + (Im(F\rho_{k-1}+U_k))^2}$$

means for multiplying the output of said square root device by a real number F, where $0 \leq F \leq 1$, to produce the input to said first delay element;

a second delay element which stores the previously generated frequency estimate $\hat{\Psi}_{k-1}$;

a phase detector which acts upon the output of said first summation element and upon the imaginary part of the output of said converter to produce $\arg(F\rho_{k-1}+U_k)$; and a third summation element which acts upon the output of said phase detector and said second delay element to produce the normalized frequency offset estimates $\hat{\Psi}_k$ where $$\hat{\Psi}_k = \hat{\Psi}_{k-1} + \arg(F\rho_{k-1}+U_k),$$

the output of this third summation element being also the input to said second delay element.

14. The system of claim 13 wherein the means for deriving the phase correction terms $\hat{\theta}_l$ induces a 1:2 sample and hold element acting upon the output of the third summation element to replicate the value of the normalized frequency estimate $\hat{\Psi}_k$ over two consecutive sampling intervals of the input sequence $Z_l$;

a delay element to store the previously generated phase rotation term $\hat{\theta}_{l-1}$; and a summation element acting upon the outputs of said 1:2 sample and hold element and said delay element to produce the phase rotation term $\hat{\theta}_l$ where $$\hat{\theta}_l = \hat{\theta}_{l-1} + \hat{\Psi}_k \quad k=(l-1)/2$$

or equivalently, $$\hat{\theta}_{2k+2} = \hat{\theta}_{2k+1} + \hat{\Psi}_k$$

$$\hat{\theta}_{2k+2} = \hat{\theta}_{2k} + \hat{\Psi}_k,$$

whereby the output of said summation element serves as the input for said delay element and for said phase shifter.

* * * * *

UNITED STATES PATENT AND TRADEMARK OFFICE
CERTIFICATE OF CORRECTION

PATENT NO. : 4,520,493

DATED : May 28, 1985

INVENTOR(S) : C. M. HEARD et al.

Page 1 of 2

It is certified that error appears in the above-identified patent and that said Letters Patent is hereby corrected as shown below:

Item (56), References cited, Other Publication Front page, column 2, line 1, delete "Inglewood Clifs" and insert --Englewood Cliffs--.

Column 20, lines 14-15, delete the formula and insert:

$$z_\ell = \left. \int_{-\ell}^{t} h(t-t') \, z(t') e^{-j\omega_0 t'} \, dt' \right]_{t=\ell \cdot T_s}$$

Column 20, line 50, delete the formula and insert:

$$\hat{\psi}_k = \hat{\psi}_{k-1} + \arg(F\rho_{k-1} + U_k)$$

Column 21, line 56, delete "sealed" and insert --scaled--.

UNITED STATES PATENT AND TRADEMARK OFFICE
CERTIFICATE OF CORRECTION

PATENT NO. : 4,520,493
DATED : May 28, 1985
INVENTOR(S) : C. M. Heard et al

It is certified that error appears in the above-identified patent and that said Letters Patent is hereby corrected as shown below:

Column 22, lines 4-5, delete the formula and insert:

$$(Re(F\rho_{k-1} + U_k))^2$$

Signed and Sealed this

Sixteenth Day of January, 1990

Attest:

JEFFREY M. SAMUELS

Attesting Officer     Acting Commissioner of Patents and Trademarks